(12) United States Patent
Kwak

(10) Patent No.: US 7,586,259 B2
(45) Date of Patent: Sep. 8, 2009

(54) FLAT PANEL DISPLAY DEVICE AND METHOD OF MAKING THE SAME

(75) Inventor: Won Kyu Kwak, Seongnam-si (KR)

(73) Assignee: Samsung SDI Co., Ltd. (KR)

( * ) Notice: Subject to any disclaimer, the term of this patent is extended or adjusted under 35 U.S.C. 154(b) by 396 days.

(21) Appl. No.: 11/640,581

(22) Filed: Dec. 18, 2006

(65) Prior Publication Data

US 2007/0176551 A1   Aug. 2, 2007

(30) Foreign Application Priority Data

Jan. 27, 2006   (KR) .................. 10-2006-0008809

(51) Int. Cl.
*H01J 17/12* (2006.01)
(52) U.S. Cl. ...................... 313/512; 313/506
(58) Field of Classification Search ............. 313/512, 313/498, 505, 506, 509
See application file for complete search history.

(56) References Cited

U.S. PATENT DOCUMENTS

| | | | |
|---|---|---|---|
| 5,953,094 A | 9/1999 | Matsuoka et al. | |
| 6,072,556 A | 6/2000 | Hirakata et al. | |
| 6,113,450 A | 9/2000 | Narayanan et al. | |
| 6,555,025 B1 | 4/2003 | Krupetsky et al. | |
| 6,632,116 B2 | 10/2003 | Watanabe et al. | |
| 6,998,776 B2 | 2/2006 | Aitken et al. | |
| 2004/0169174 A1 | 9/2004 | Huh et al. | |
| 2005/0184927 A1 | 8/2005 | Kwak | |
| 2005/0190335 A1 | 9/2005 | Maruyama et al. | |
| 2005/0233885 A1 | 10/2005 | Yoshida et al. | |
| 2005/0248270 A1 | 11/2005 | Ghosh et al. | |

FOREIGN PATENT DOCUMENTS

| | | |
|---|---|---|
| EP | 1176456 A2 | 1/2002 |
| KR | 10-2003-0080895 A | 10/2003 |
| KR | 10-2004-0002956 A | 1/2004 |
| KR | 10-2006-0005369 A | 1/2006 |

OTHER PUBLICATIONS

European Search Report dated Sep. 24, 2007 from corresponding European patent application No. 07101243.9 in 6 pages.
Notice of Allowance issued in the counterpart Korean Application No. 10-2006-0008809 in 2 pages.

*Primary Examiner*—Vip Patel
(74) *Attorney, Agent, or Firm*—Knobbe Martens Olson & Bear LLP

(57) ABSTRACT

Disclosed is a method of making a flat panel display device including a first substrate, an array of pixels, a second substrate opposing the first substrate, and a frit formed between the first substrate and the second substrate to encapsulate the array. A buffer layer is formed on the first substrate, an insulating film is formed on the buffer layer, and a portion of the insulating film is etched. A metal conductive line is formed on the etched portion and on the non-etched portion of the insulating film. A protective film is formed on the insulating film and the conductive line.

6 Claims, 6 Drawing Sheets

FLAT PANEL DISPLAY DEVICE AND METHOD OF MAKING THE SAME

CROSS-REFERENCE TO RELATED APPLICATIONS

This application claims the benefit of Korean Patent Application No. 10-2006-0008809, filed on Jan. 27, 2006, in the Korean Intellectual Property Office, the disclosure of which is incorporated herein by reference in its entirety. This application is related to and incorporates herein by reference the entire contents of the following concurrently filed applications:

| Title | Atty. Docket No. | Filing Date | Application No. |
|---|---|---|---|
| FLAT PANEL DISPLAY DEVICE AND METHOD OF MAKING THE SAME | SDISHN.076AUS | | |
| FLAT PANEL DISPLAY DEVICE AND METHOD OF MAKING THE SAME | SDISHN.094AUS | | |

BACKGROUND

1. Field of the Invention

The present invention relates to a flat panel display device, and more particularly, to encapsulating a flat panel display device.

2. Discussion of Related Technology

Recently, various flat panel display devices such as a liquid display device, an organic light-emitting display device, a PDP, a FED, etc. have been introduced. These flat panel display devices can be easily implemented in a large area and have therefore been greatly spotlighted. In general, such a flat panel display devices has a structure that comprises a plurality of pixels on a substrate and covers the substrate with a metal cap or an encapsulating glass substrate to encapsulate it. In particular, an organic light-emitting display device using an organic light-emitting diode is sensitive to oxygen, hydrogen and moisture and thus, requires a more robust encapsulating structure so that oxygen, etc. cannot be infiltrated thereto.

A frit is formed in the form of a glass powder, if the temperature of heat applied to glass material is abruptly dropped. In general, it is used by adding oxide powder into glass powder. And, if the frit including oxide powder is added with organic substance, it becomes paste in a gel state. At this time, if the frit is burned at a predetermined temperature, organic material is vanished into air, and the paste in a gel state is cured so that the frit exists in a solid state. In U.S. Pat. No. 6,998,776 a structure to encapsulate an organic light-emitting diode by applying a frit to a glass substrate is disclosed.

The discussion in this section is to provide general background information, and does not constitute an admission of prior art.

SUMMARY

An aspect of the invention provides a method of making a display device, which may comprise: providing a first substrate, an insulating layer formed over the first substrate and a structure interposed between the first substrate and the insulating layer; selectively etching a portion of the insulating layer so as to expose a portion of the structure; forming a conductive line on the exposed portion of the structure and the non-etched portion of the insulating layer, wherein the conductive line generally extends in a first direction and comprising a first portion which is formed on the exposed portion of the structure, wherein the conductive line has a width in the first portion thereof, the width being measured in a second direction perpendicular to the first direction, wherein the exposed portion of the structure has a width measured in the second direction, wherein the width of the exposed portion is greater than the width of the conductive line in the first portion; forming a protective layer over the conductive line and a non-etched portion of the insulation layer; arranging a second substrate relative to the first substrate such that the protective layer is interposed between the first and second substrates; interposing a frit between the protective layer and second substrate; and wherein the frit overlaps with the first portion of the conductive line when viewed in a third direction from the first substrate, and wherein the third direction is perpendicular to the first and second directions.

In the foregoing method, the protective layer may comprise a first portion and a second portion, wherein the first portion of the protective layer is interposed between the frit and first portion of the conductive line, wherein the second portion of the protective layer is interposed between the frit and the non-etched portion of the insulating layer while not interposed between the frit and the first portion of the conductive line, wherein the protective layer has a first thickness in the first portion of the protective layer, the first thickness being measured in the third direction, wherein the protective layer comprises a first surface in the first portion thereof, the first surface facing the second substrate, wherein the protective layer comprises a second surface in the second portion thereof, the second surface facing the second substrate, and wherein a distance between the first surface and the second surface in the third direction may be equal to or smaller than about the first thickness. The distance may be equal to or smaller than about a half of the first thickness. The distance may be equal to or smaller than about a third of the first thickness.

Still in the foregoing method, the protective layer may comprise a first portion and a second portion, wherein the first portion of the protective layer is interposed between the frit and the first portion of the conductive line, wherein the second portion of the protective layer is interposed between the frit and the non-etched portion of the insulating layer while not interposed between the frit and the first portion of the conductive line, wherein the protective layer comprises a first surface in the first portion thereof, the first surface facing the second substrate, wherein the protective layer comprises a second surface in the second portion thereof, the second surface facing the second substrate, and wherein interposing the frit may comprise placing the frit between the first and second substrates such that the frit contacts both the first surface and the second surface. The protective layer may comprise a first portion and a second portion, wherein the first portion of the protective layer is interposed between the frit and the first portion of the conductive line, wherein the second portion of the protective layer is interposed between the frit and the non-etched portion of the insulating layer while not interposed between the frit and the first portion of the conductive line, wherein the protective layer comprises a first surface in the first portion thereof, the first surface facing the second substrate, wherein the protective layer comprises a second surface in the second portion thereof, the second surface facing the second substrate, and wherein a distance between the first surface and the second surface in the third direction may be equal to or less than about 3000 Å.

Further in the foregoing method, the protective layer may comprise a first portion and a second portion, wherein the first portion of the protective layer is interposed between the frit and the first portion of the conductive line, wherein the second portion of the protective layer is interposed between the frit and the non-etched portion of the insulating layer while not interposed between the frit and the first portion of the conductive line, wherein the insulating layer has a second thickness in the non-etched portion thereof, the second thickness being measured in the third direction, wherein the protective layer comprises a first surface in the first portion thereof, the first surface facing the second substrate, wherein the protective layer comprises a second surface in the second portion thereof, the second surface facing the second substrate, and wherein the distance between the first surface and the second surface in the third direction may be equal to or smaller than about the second thickness. The distance may be equal to or smaller than about a half of the second thickness. The distance may be equal to or smaller than about a third of the second thickness. The protective layer may comprise a first portion and a second portion, wherein the first portion of the protective layer is interposed between the frit and the first portion of the conductive line, wherein the second portion of the protective layer is interposed between the frit and the non-etched portion of the insulating layer while not interposed between the frit and the first portion of the conductive line, wherein the protective layer comprises a first surface in the first portion thereof, the first surface facing the second substrate, wherein the protective layer comprises a second surface in the second portion thereof, the second surface facing the second substrate, wherein the first surface has a first shortest distance measured in the third direction between the first substrate and the first surface, wherein the second surface has a second shortest distance measured in the third direction between the first substrate and the second surface, wherein the second shortest distance may be equal to or greater than the first shortest distance.

Still further in the foregoing method, the frit may overlap with the first portion of the conductive line substantially throughout the entire width of the conductive line in the first portion thereof. The frit may comprise an elongated segment overlapping with the first portion of the conductive line, the elongated segment generally extending along the second direction. The insulating layer may comprise a first insulating film and the second insulating film, the first insulating film being interposed between the first substrate and the second insulating film. The structure may comprise another insulating layer interposed between the first substrate and the insulating layer, the first portion of the conductive line contacting the other insulating layer in the exposed portion of the structure. Interposing the frit may comprise forming the frit one of the first and second substrates and arranging the first and second substrates such that the frit is interposed between the first and second substrates.

Another aspect of the invention provides a display device which may comprise: a first substrate; a second substrate opposing the first substrate; a frit seal interposed between the first substrate and the second substrate; a conductive line generally extending in a first direction and comprising a first portion which is interposed between the first substrate and the frit seal, wherein the conductive line has an width in the first portion thereof measured in a second direction, which is perpendicular to the first direction, wherein the frit seal overlaps with the first portion when viewed in a third direction from the first substrate, the third direction being perpendicular to the first and second directions; and a protective layer comprising a first portion and a second portion, wherein the first portion of the protective layer is interposed between the frit seal and the first portion of the conductive line, wherein the second portion of the protective layer is interposed between the frit seal and the first substrate while not interposed between the frit seal and the first portion of the conductive line, wherein the protective layer comprises a first surface in the first portion thereof, the first surface facing the second substrate, wherein the protective layer comprises a second surface in the second portion thereof, the second surface facing the second substrate, wherein the protective layer has a first thickness in the first portions thereof, the first thickness being measured in the third direction, wherein a distance between the first surface and the second surface in the third direction is equal to or smaller than about the first thickness. The distance may be equal to or smaller than about a half of the first thickness. The distance may be equal to or smaller than about a third of the first thickness. The distance is equal to or less than about 3000 Å.

In the foregoing device, the first surface may have a first shortest distance measured in the third direction between the first substrate and the first surface, wherein the second surface has a second shortest distance measured in the third direction between the first substrate and the second surface, and wherein the second shortest distance is equal to or greater than the first shortest distance. The device may further comprise an insulating layer interposed between the first substrate and the protective layer while not interposed between the first substrate and the first portion of the protective layer.

Still another aspect of the present invention provides a flat panel display device and a method of the same, preventing damage on a metal film by heat generated when encapsulating a flat panel display device and improving adhesion of a frit.

Further aspect of the present invention provides a flat panel display device comprising: a depositing substrate dividing into a pixel region including a pixel comprising a plurality of organic films and a plurality of metal layers and a non-pixel region on which a metal film transferring a signal to the pixel is formed; a sealing substrate opposed to a predetermined region including the pixel region of the first substrate; and a frit formed between the depositing substrate and the sealing substrate to encapsulate the depositing substrate and the sealing substrate, wherein the non-pixel region of the depositing substrate comprises a transparent substrate on which a buffer layer is formed, an insulating film formed on the buffer layer by extending the organic film, the metal film formed on the predetermined region by etching a predetermined region of the insulating film, and a protective film formed on the insulating the metal film.

Still further aspect of the present invention provides a method for fabricating a flat panel display device displaying an image by generating a pixel using an organic film and a metal film, the method comprising the steps of: forming the organic film on a depositing substrate on which a buffer layer is formed; etching a predetermined region of the regions on which the organic film is formed and depositing the metal film on the predetermined region; forming a protective film on the upper of the organic film and the metal film; and encapsulating the pixel region of the depositing substrate with a sealing substrate using a frit.

BRIEF DESCRIPTION OF THE DRAWINGS

These and other aspects and advantages of the invention will become apparent and more readily appreciated from the following description of the embodiments, taken in conjunction with the accompanying drawings of which.

DETAILED DESCRIPTION OF EMBODIMENTS

Hereinafter, various embodiments of the present invention will be described in a more detailed manner with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 6A:
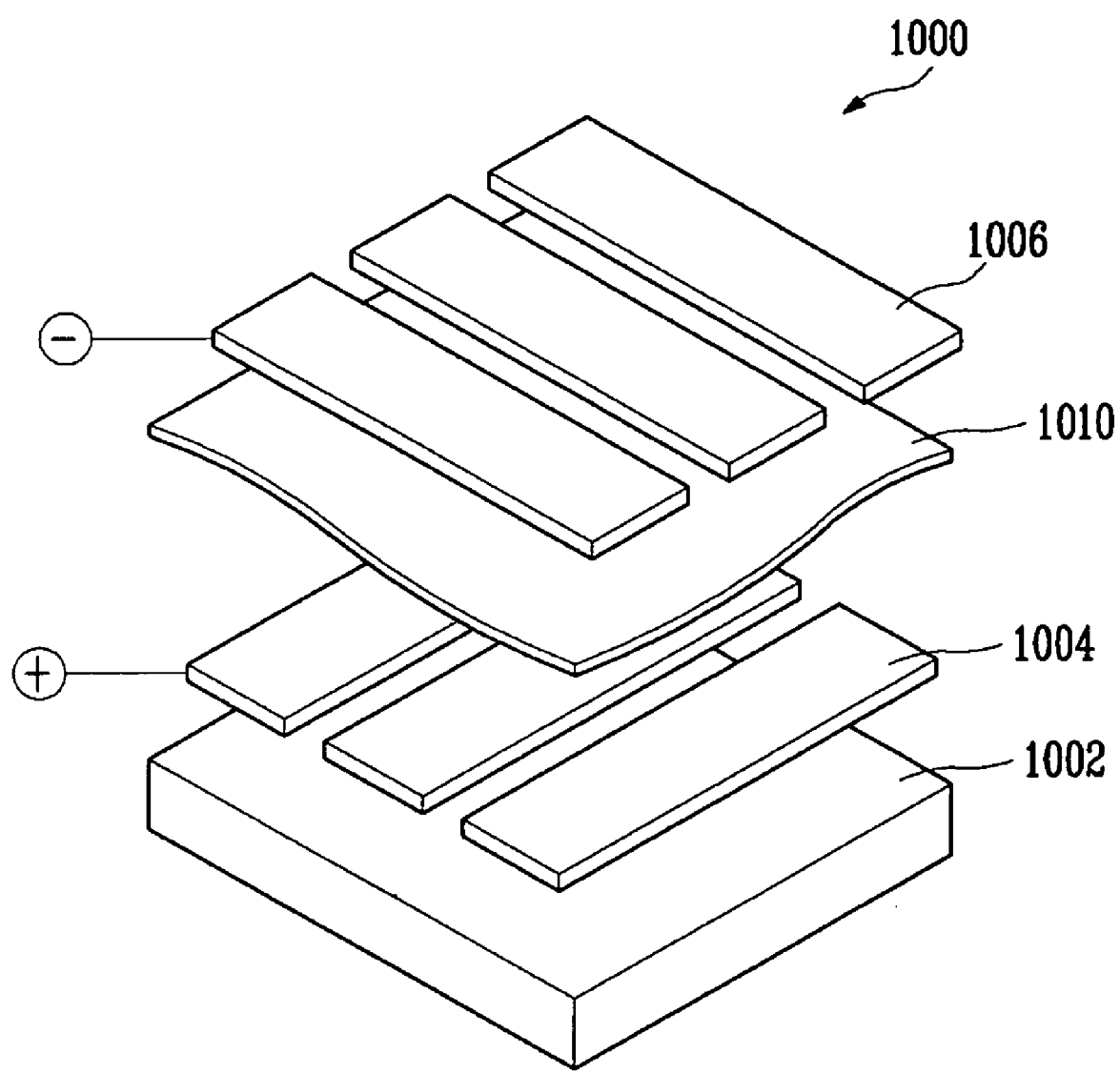
FIG. 6A is a schematic exploded view of a passive matrix type organic light emitting display device in accordance with one embodiment.
Figure 6B:
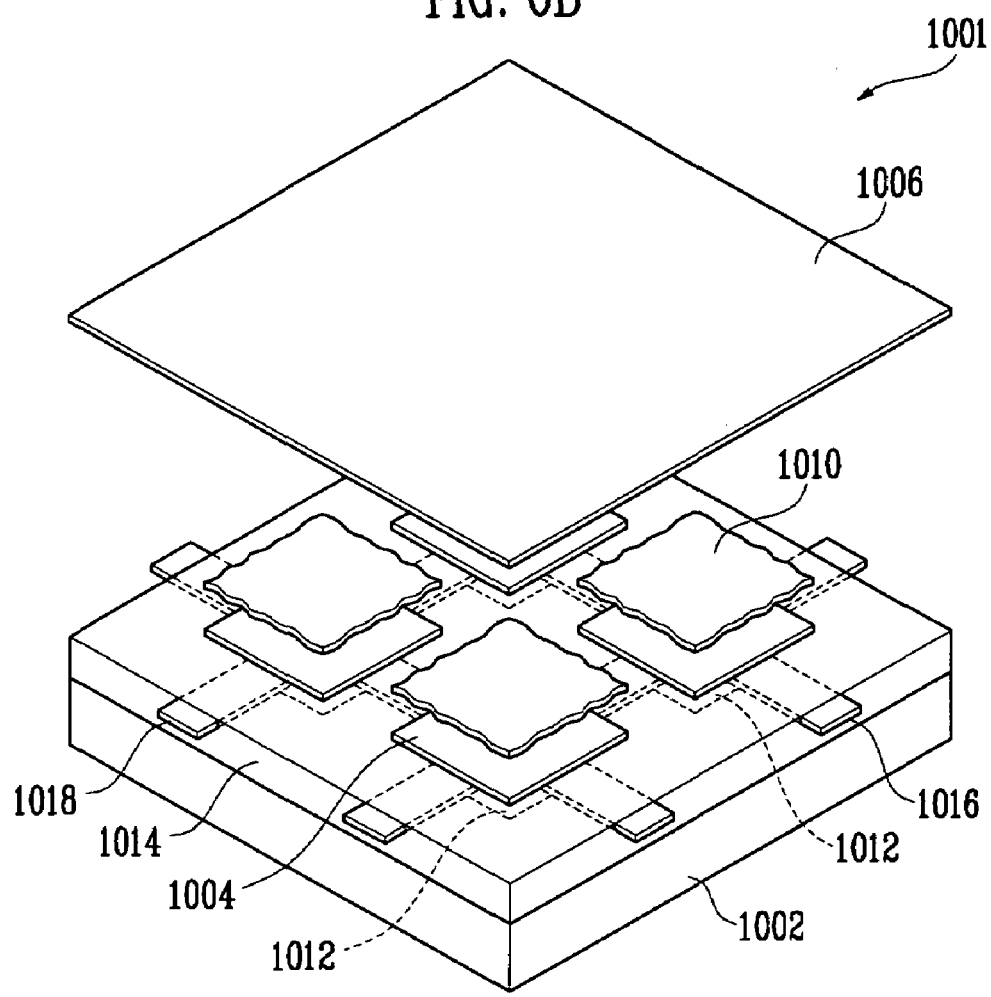
FIG. 6B is a schematic exploded view of an active matrix type organic light emitting display device in accordance with one embodiment.

OLEDs can be generally grouped into two basic types dependent on the arrangement with which the stimulating electrical current is provided. FIG. 6A schematically illustrates an exploded view of a simplified structure of a passive matrix type OLED 1000. FIG. 6B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 6A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 6B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is oppositely arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 6C:
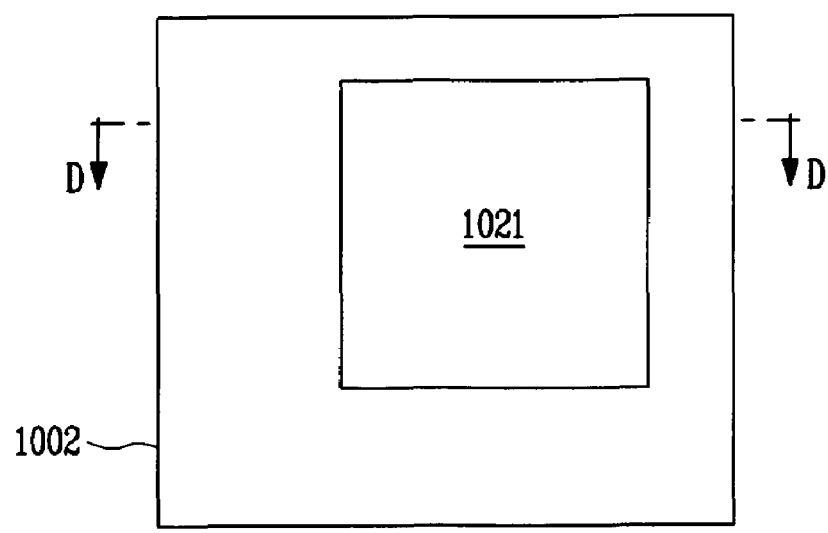
FIG. 6C is a schematic top plan view of an organic light emitting display in accordance with one embodiment.

In many embodiments, an OLED pixel array 1021 comprising a plurality of organic light emitting pixels is arranged over a substrate 1002 as shown in FIG. 6C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 6D:
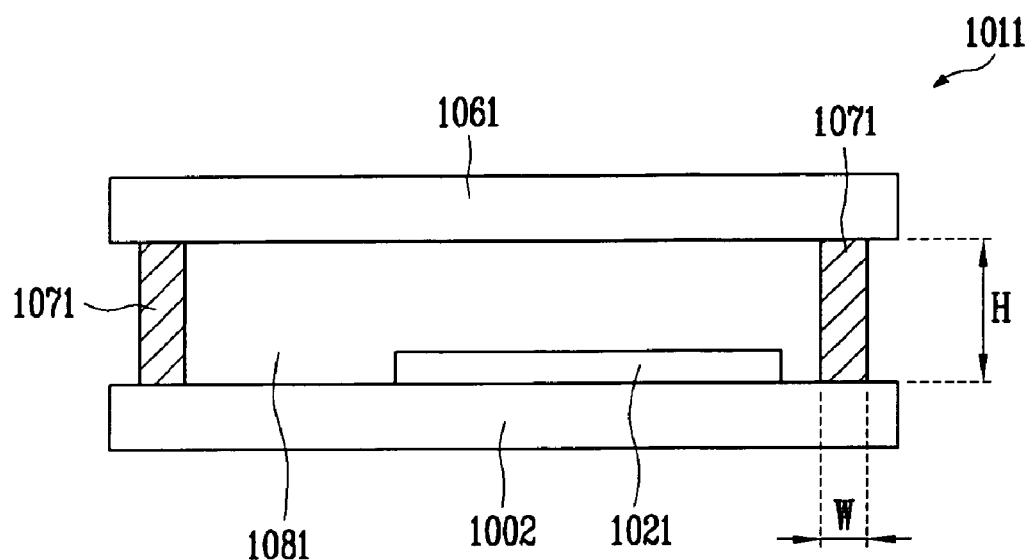
FIG. 6D is a cross-sectional view of the organic light emitting display of FIG. 6C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 6D schematically illustrates a cross-section of an encapsulated OLED device 1011 having a layout of FIG. 6C and taken along the line d-d of FIG. 6C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ $cc/m^2$-day and to water of less than $10^{-6}$ $g/m^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 6D. The width varies among embodiments and ranges from about 300 µm to about 3000 µm, optionally from about 500 µm to about 1500 µm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 6D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass "frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 6E:
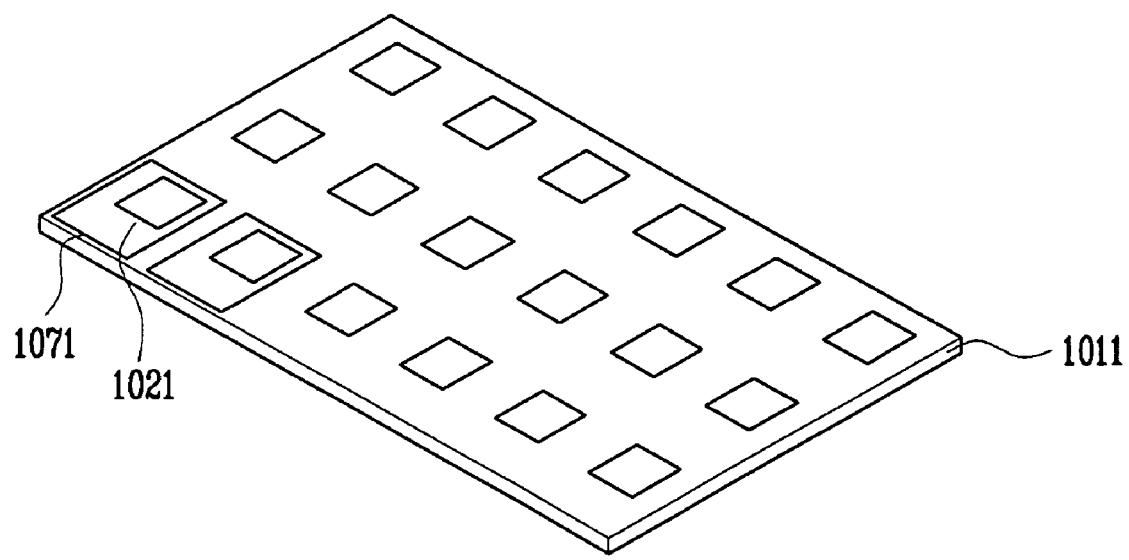
FIG. 6E is a schematic perspective view illustrating mass production of organic light emitting devices in accordance with one embodiment.

In some embodiments, OLED devices 1011 are mass produced. In an embodiment illustrated in FIG. 6E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 6D. In certain embodiments, the individual OLED devices 1011 then further undergo additional packaging operations to further improve the sealing formed by the frit seal 1071 and the top and bottom substrates 1061, 1002.

Figure 1:
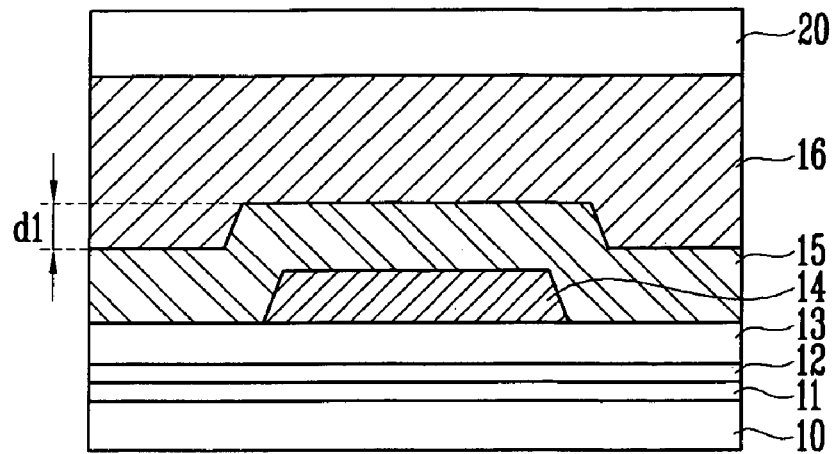
FIG. 1 is a cross-sectional view for showing a cross-section of a state that a depositing substrate and a sealing substrate are encapsulated by using a frit in a flat panel display panel.

FIG. 1 is a cross-sectional view showing a state that a depositing substrate and a sealing substrate are encapsulated by using a frit in a general flat display device. Referring to FIG. 1, a buffer layer 11 is applied on the upper of a depositing substrate 10, a first insulating film 12 is applied on the upper of the buffer layer 11 and a metal film 14 is then patterned. The first insulating film 12 and the second insulating film 13 are applied on a transparent substrate 10 during the process of forming a pixel, and the metal film 14 is formed on the upper of the second insulating film 13 in a certain shape to be a wire transferring a signal to the pixel. As a wire there are a scan line for transferring a scan signal, a data line for transmitting a data signal and a pixel power line for transferring pixel power, etc. And, a protective film 15 is formed on the upper of the second insulating film 13 on which the metal film 14 is formed. The protective film 15 has a step distance d1 by the metal film, wherein the step to the extent corresponding to the thickness of the metal film 14 is formed. If the thickness of the first insulating film 12 is about 1200 Å, the thickness of the insulating film 13 is 5000 Å, the thickness of the metal film 14 is about 5000 Å and the thickness of the protective film 15 is about 6000 Å, the distance d1 becomes about 5000 Å.

And, the depositing substrate 10 is encapsulated with a sealing substrate 20 using a frit 16. The encapsulating process is that after the frit 16 in a solid state is located between the sealing substrate 20 and the depositing substrate 10, in a state that the frit 16 has viscosity by means of heat, etc. the frit is contacted and cured with the m to encapsulate the depositing substrate with the sealing substrate.

At this time, when the frit 16 is in a solid state during the sealing process, it is contacted with the portion on which the metal film 14 is formed and not contacted with portions other than the portion due to the elevated portion or step of the protective film 15. In this state, if the frit 16 is heated for more than a certain time, the frit 16 has viscosity and becomes a hot state. At this time, the frit 16 in a solid state is contacted with even the portion not contacted by the protective film 15 and the distance d1, that is, the portion on which the metal film is not formed. And, the contact time of the heated frit and the portion on which the metal film 14 is formed is longer than the contact time of the heated frit 16 and the portion on which the metal film is not formed due to the step, resulting in that a great deal of heat is transferred to the metal film 14 formed beneath the lower of the frit 16. At this time, the protective film 15 has a large thermal conductivity coefficient and therefore, it cannot prevent the transmission of heat to the metal film. Accordingly, the heat generated from the frit 16 is transferred to the metal film 14, causing a problem that the metal film 14 is melted. If the metal film 14 is melted, cracks, etc. are generated during the process of re-curing, resulting in that a wire defect can be generated.

Figure 2:
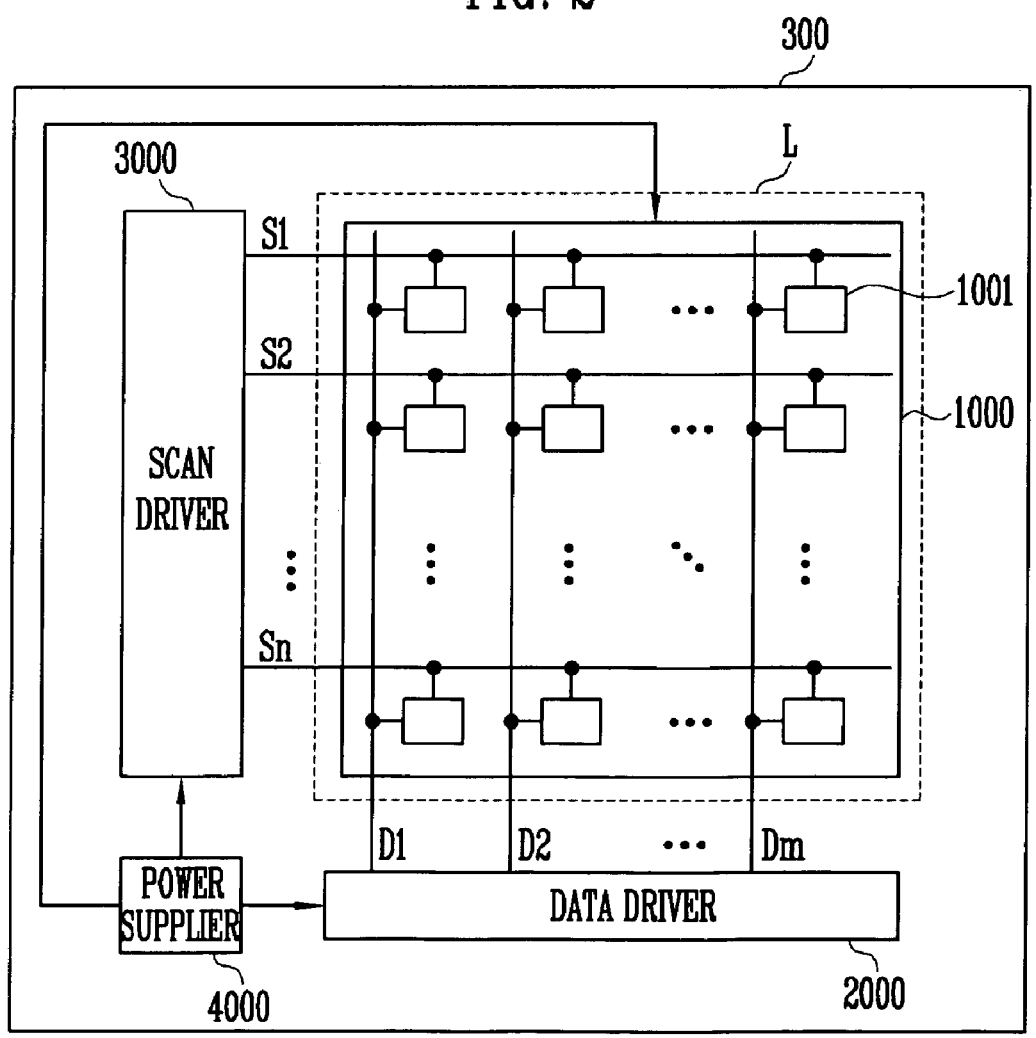
FIG. 2 is a structural view for showing a structure of a flat panel display device according to an embodiment of the present invention.

FIG. 2 is a structural view for showing a structure of a flat panel display device according to an embodiment of the present invention. Referring to FIG. 2, a flat panel display device comprises a substrate 1900, a data driver 2000, a scan driver 3000 and a power supplier 4000. The substrate 1900 is formed by opposing a depositing substrate 3000 on which a pixel 1001 is formed to a sealing substrate sealing the depositing substrate at a predetermined distance. The depositing substrate is divided into a pixel region and a non-pixel region, and the sealing substrate is formed to be wider than the pixel region and a frit is thus formed in the portion shown in dotted line L, thereby encapsulating the depositing substrate and the sealing substrate with the frit. Also, the depositing substrate is provided with a data line, a scan line and a power line, etc., and can thus receive a data signal, a scan signal and power, etc. from the external.

The data driver 2000 connected to data lines D1, D2 ... Dm, generates data signals and transfers the data signals via the data lines D1, D2 ... Dm. At this time, the data lines D1, D2 ... Dm are formed on the upper of the depositing substrate so that the data lines D1, D2 ... Dm pass through the lower of the frit. The scan driver 3000 connected to scan lines S1, S2 ... Sn, generates scan signals and transfers the scan signals via the scan lines. At this time, the scan lines S1,S2 ... Sn are formed on the upper of the depositing substrate, so that the scan lines S1,S2 ... Sn pass through the lower of the frit. The power supplier 4000 transfers driving voltage to the substrate 1000, the data driver 2000 and the scan driver 3000, etc. to drive the substrate 1000, the data driver 2000 and the scan driver 3000, etc. At this time, a power line is formed on the upper of the depositing substrate, so that the power line passes through the lower of the frit.

Figure 3:
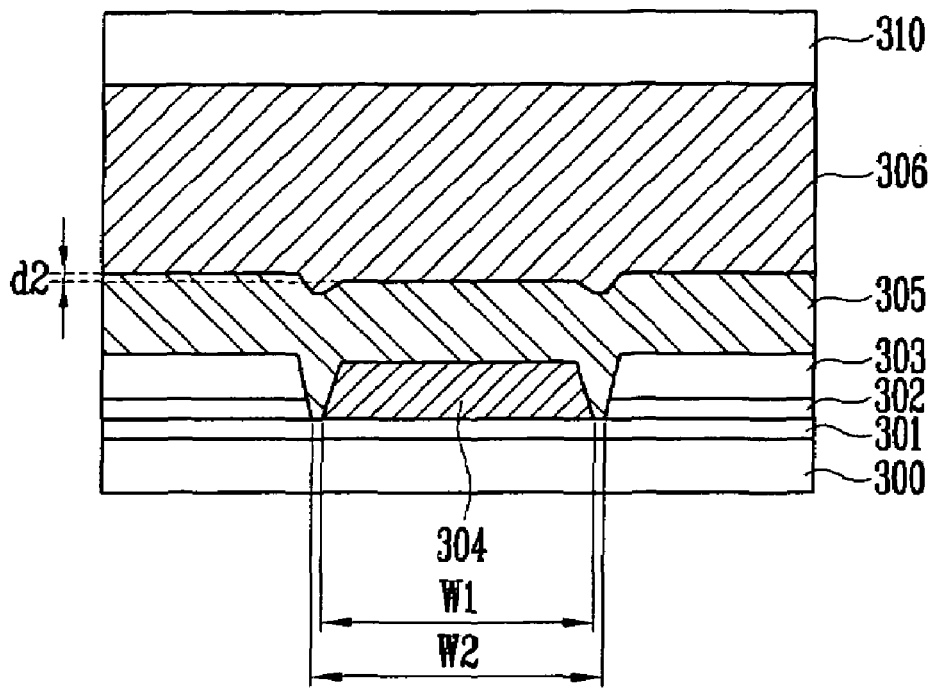
FIG. 3 is a cross-sectional view for showing a cross-section of an embodiment of a flat panel display device shown in FIG. 2.

FIG. 3 is a cross-sectional view for showing a cross-section of an embodiment of a flat panel display device shown in FIG. 2. Referring to FIG. 3, a cross-section of a non light-emitting region of a substrate is shown. In the illustrated embodiment, a buffer layer 301 is formed on a transparent substrate 300, a first insulating film 302 is formed on the buffer layer 301 and a second insulating film 303 is formed on the upper of the first insulating film 302. And, after etching a predetermined portion of the first insulating film 302 and the second insulating film 303, a metal film or conductive line 304 is formed on the etched portion. As the metal film 304 used as a wire transferring a signal or voltage to the pixel region and, there are scan lines for transferring a scan signal, data lines for transmitting a data signal and a pixel power line for transmitting a pixel power, etc. The conductive line 304 generally extends along a first direction and has a width W1 in a portion thereof, the width being measured in a second direction which is perpendicular to the first direction. The exposed portion by etching has a width W2 measured in the second direction, which is greater than the width W1.

In this embodiment and other embodiments, if the thickness of the metal film 304, which is measured in a third direction perpendicular to the first and second directions, corresponds to the sum of the thickness of the first insulating film 302 and the second insulating film 303, no difference in height is occurred between the upper of the metal film 304 and the upper of the second insulating film 303. And, the depositing substrate is fabricated by forming the protective film 305 on the metal film 304. The protective film 305 is formed on the upper of the second insulating film 303 on which the metal film 304 is formed. The protective film 304 may have an elevated distance d2, which is measured in the third direction, according to the varying of thicknesses of the metal film 304 and the insulating films 302 and 303. If the thickness of the first insulating film 302 is about 1200 Å, the thickness of the second insulating film 303 is about 5000 Å, the thickness of the metal film 304 is about 5000 Å and the thickness of the protective film 305 is about 6000 Å, the distance d2 becomes about 1200 Å and the distance d2 becomes low.

And, after forming the frit 306 in the sealing substrate 310 and coupling with the depositing substrate, the frit 306 is heated by laser or infrared rays to perform a sealing process encapsulating the depositing substrate and the sealing substrate 310 with the frit 306. At this time, the frit 306 is in a state contacting with a portion of the protective film by maintaining a solid state prior to the sealing process, and the frit in a state having viscosity by laser or infrared rays, etc. is contacted and cured with the protective film 305 to encapsulate the depositing substrate with the sealing substrate 310 during the sealing process.

Figure 4:
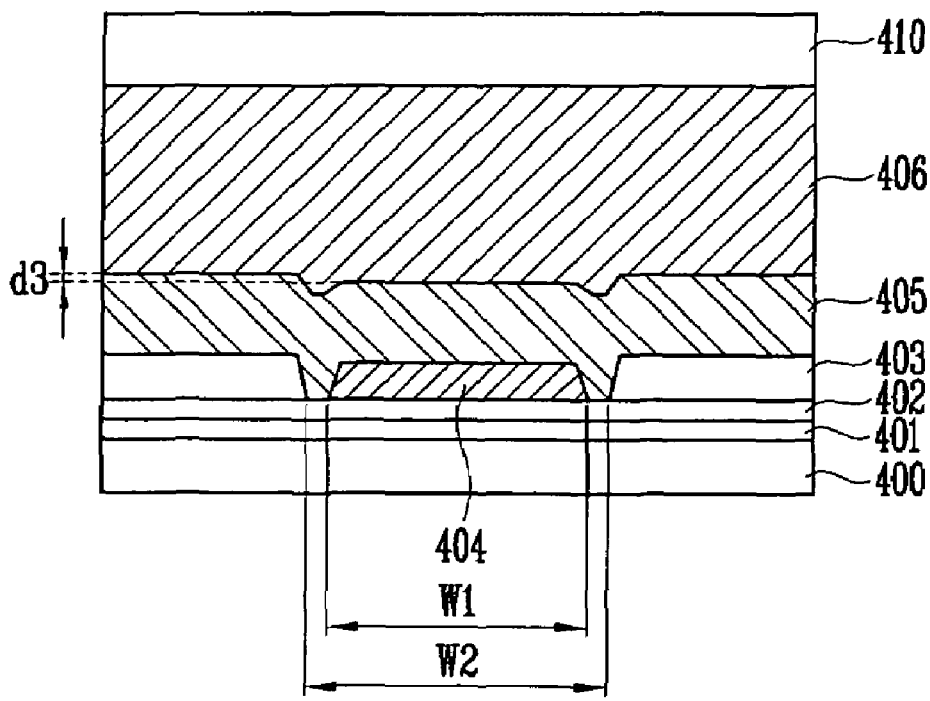
FIG. 4 is a cross-sectional view for showing a cross-section of an embodiment of a flat panel display device shown in FIG. 2.

FIG. 4 is a cross-sectional view for showing a cross-section of an embodiment of a flat panel display device shown in FIG. 2. The difference between the embodiment shown in FIG. 4 and the embodiment shown in FIG. 3 is to form the metal film 404 on the etched region after etching only the second insulating film 403. At this time, the thickness of the metal film set to be thinner than the metal film shown in FIG. 3 in order to reduce the difference d3 in height, which is measured in the third direction, between the portion on which the metal film 404 is formed and portions other than the portion. At this time, the distance d3 is about 1200 Å.

In certain embodiments, the distance d2 or d3 is about 0, 10, 20, 30, 40, 50, 60, 70, 80, 90, 100, 150, 200, 250, 300, 400, 500, 700, 1000, 1500, 2000, 2500, 3000 or 3500 Å. In some embodiments, the distance d2 or d3 may be within a range defined by two of the foregoing distances. In certain embodiments, the ratio of the distance d2 or d3 to a thickness of the protective layer is about 0.001, 0.002, 0.005, 0.01, 0.02, 0.05, 0.1, 0.2, 0.3, 0.4, 0.5, 0.7 or 1.0. In some embodiments, the ratio of the distance d2 or d3 to a thickness of the protective layer may be within a range defined by two of the foregoing numerals. In certain embodiments, the ratio of the distance d2 or d3 to a thickness of the second insulating layer is about 0.001, 0.002, 0.005, 0.01, 0.02, 0.05, 0.1, 0.2, 0.3, 0.4, 0.5, 0.7 or 1.0. In some embodiments, the ratio of the distance d2 or d3 to the thickness of the second insulating layer may be within a range defined by two of the foregoing numerals.

Figure 5:
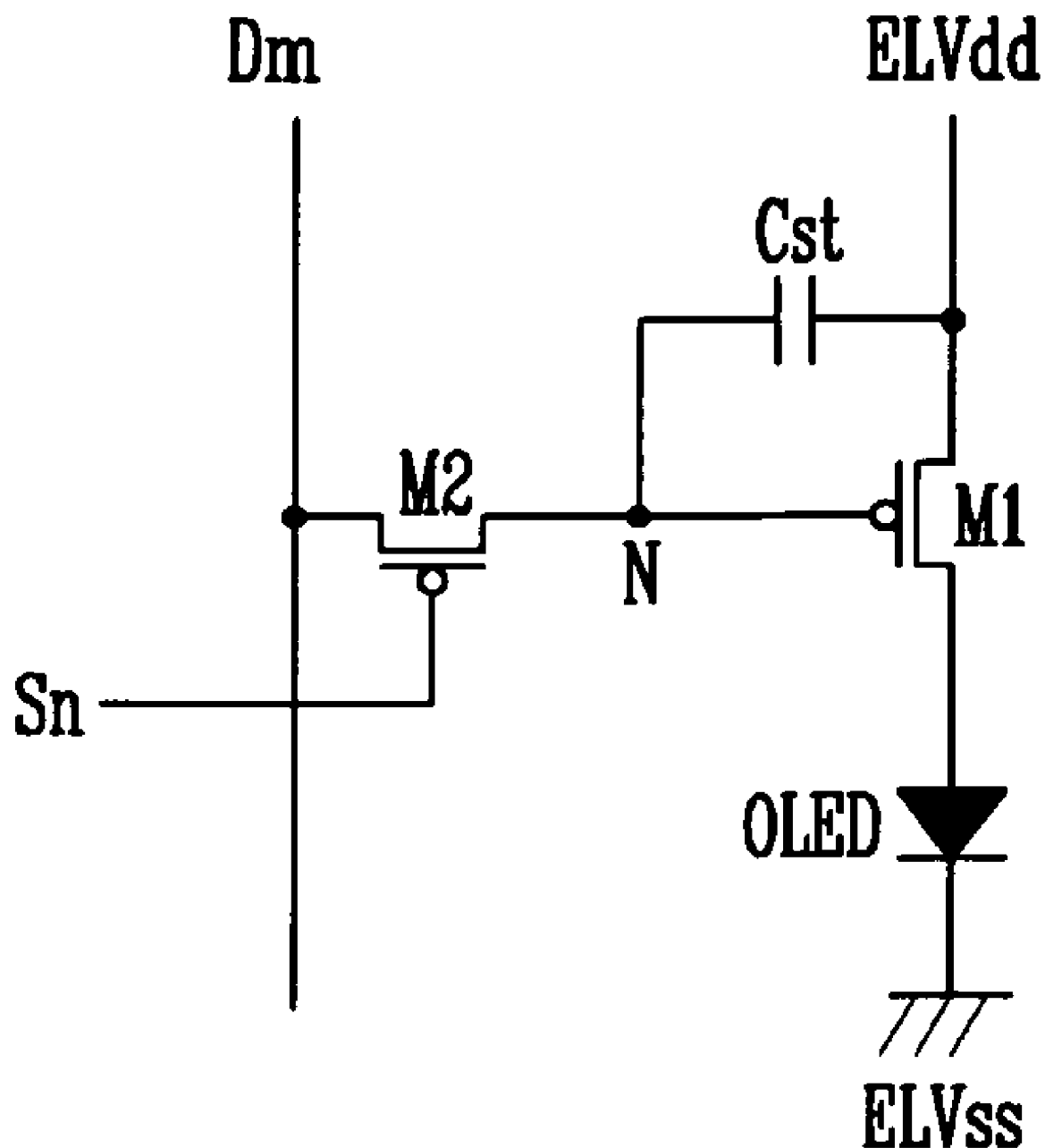
FIG. 5 is a circuit view for showing one example of a pixel in case that a flat panel display device according to an embodiment the present invention is an organic light-emitting display device.

FIG. 5 is a circuit view for showing one example of a pixel in case that a flat panel display device according to an embodiment of the present invention is an organic light-emitting display device. Referring to FIG. 5, a pixel comprises an organic light emitting device (Organic Light Emitting Device: OLED), a first transistor (Thin Film Transistor: M1), a second transistor M2 and a capacitor Cst. And, a scan line Sn, a data line Dm and a power line ELVdd are connected to pixels. And, the scan line is formed in a row direction, and the data line Dm and the power line ELVdd are formed in a column direction. The first transistor M1 has a structure that a source electrode is connected to a pixel power line Vdd, a drain electrode is connected to the OLED, and a gate electrode is connected to a first node N. And, current for light-emitting is supplied to the organic light-emitting element OLED by a signal input into the gate electrode. The amount of current flowing from the source to the drain of the first transistor M1 is controlled by the data signal applied via the second transistor M2. The second transistor M2 has a structure that a source electrode is connected to the data line Dm, a drain electrode is connected to the first node N, and a gate electrode is connected to the scan line Sn, thereby performing a switching operation by a scan signal transferred via the scan line Sn and selectively transmitting the data signal transferred via the data line Dm to the first node N. The capacitor Cst has a structure that a first electrode is connected to a source electrode of the first transistor M1, and a second electrode is connected to the first node N, thereby maintaining voltage applied between the source electrode and the gate electrode applied for a certain period by the data signal. With the above constitution, when the second transistor M2 is on by the scan signal applied to the gate electrode of the second transistor M2, the voltage corresponding to the data signal is charged in the capacitor Cst, the voltage charged in the capacitor Cst is applied to the gate electrode of the first transistor M1, so that the first transistor M1 allows the flow of current to light-emit the organic light-emitting element OLED.

With the flat panel display device and the method of the same according to embodiments of the present invention, since the elevated portion below the frit becomes low, the damage on the metal film by heat can be reduced, preventing the generation of cracks, etc. on the metal film, and since the lower contacting face of the frit is flat, the adhesion of the frit can be improved, more securely sealing a upper substrate and a lower substrate.

Although various embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A display device comprising:
   a first substrate;
   a second substrate opposing the first substrate;
   a frit seal interposed between the first substrate and the second substrate;
   a conductive line generally extending in a first direction and comprising a first portion which is interposed between the first substrate and the frit seal, wherein the conductive line has an width in the first portion thereof measured in a second direction, which is perpendicular to the first direction, wherein the frit seal overlaps with the first portion when viewed in a third direction from the first substrate, the third direction being perpendicular to the first and second directions; and
   a protective layer comprising a first portion and a second portion, wherein the first portion of the protective layer is interposed between the frit seal and the first portion of the conductive line, wherein the second portion of the protective layer is interposed between the frit seal and the first substrate while not interposed between the frit seal and the first portion of the conductive line, wherein the protective layer comprises a first surface in the first portion thereof, the first surface facing the second substrate, wherein the protective layer comprises a second surface in the second portion thereof, the second surface facing the second substrate, wherein the protective layer has a first thickness in the first portions thereof, the first thickness being measured in the third direction, and wherein a distance between the first surface and the second surface in the third direction is equal to or smaller than about the first thickness.

2. The device of claim 1, wherein the distance is equal to or smaller than about a half of the first thickness.

3. The device of claim 1, wherein the distance is equal to or smaller than about a third of the first thickness.

4. The device of claim 1, wherein the distance is equal to or less than about 3000 Å.

5. The device of claim 1, wherein the first surface has a first shortest distance measured in the third direction between the first substrate and the first surface, wherein the second surface has a second shortest distance measured in the third direction between the first substrate and the second surface, and wherein the second shortest distance is equal to or greater than the first shortest distance.

6. The device of claim 1, further comprising an insulating layer interposed between the first substrate and the protective layer while not interposed between the first substrate and the first portion of the protective layer.

* * * * *